(12) United States Patent
Palaniappan et al.

(10) Patent No.: US 8,707,133 B2
(45) Date of Patent: Apr. 22, 2014

(54) METHOD AND APPARATUS TO REDUCE A QUANTITY OF ERROR DETECTION/CORRECTION BITS IN MEMORY COUPLED TO A DATA-PROTECTED PROCESSOR PORT

(75) Inventors: Sathappan Palaniappan, Bangalore (IN); Dharmesh Kishor Tirthdasani, Bangalore (IN); Romeshkumar Bharatkumar Mehta, Maharashtra (IN)

(73) Assignee: LSI Corporation, San Jose, CA (US)

( * ) Notice: Subject to any disclaimer, the term of this patent is extended or adjusted under 35 U.S.C. 154(b) by 262 days.

(21) Appl. No.: 13/311,102

(22) Filed: Dec. 5, 2011

(65) Prior Publication Data

US 2013/0145227 A1    Jun. 6, 2013

(51) Int. Cl.
*G11C 29/00*    (2006.01)
*G06F 11/10*    (2006.01)
*G06F 13/14*    (2006.01)

(52) U.S. Cl.
CPC ............... *G06F 11/10* (2013.01); *G06F 13/14* (2013.01)
USPC ........................................................ 714/763

(58) Field of Classification Search
CPC .... G06F 13/14; G06F 11/10; G01R 31/31713
USPC ................................. 714/718–726
See application file for complete search history.

(56) References Cited

U.S. PATENT DOCUMENTS

| | | | | |
|---|---|---|---|---|
| 5,379,304 A | * | 1/1995 | Dell et al. | 714/758 |
| 6,009,548 A | * | 12/1999 | Chen et al. | 714/762 |
| 6,108,730 A | * | 8/2000 | Dell et al. | 710/301 |
| 6,813,727 B2 | * | 11/2004 | Froeschl et al. | 714/10 |
| 7,263,647 B2 | * | 8/2007 | Bryant et al. | 714/758 |
| 7,353,438 B2 | | 4/2008 | Leung et al. | |
| 7,392,456 B2 | | 6/2008 | Leung et al. | |
| 8,495,467 B1 | * | 7/2013 | Billing et al. | 714/764 |
| 2006/0156196 A1 | | 7/2006 | Takahashi et al. | |
| 2008/0005646 A1 | | 1/2008 | Bains | |

* cited by examiner

*Primary Examiner* — Steve Nguyen
(74) *Attorney, Agent, or Firm* — Otterstedt, Ellenbogen & Kammer, LLP

(57) ABSTRACT

An interface device to interface a processing device and a memory device includes an error correcting code (ECC) encoder to calculate ECC bit(s) and to provide the ECC bit(s) to the processing device based at least in part on data provided by the memory device, thereby eliminating a need to store the ECC bits in the memory device. The interface device may include a parity encoder to provide parity bit(s) to the memory device as a function of data provided by the processing device, and a parity decoder to selectively modify the ECC bit(s) as a function of the data and parity bit(s) provided by the memory device. The ECC encoder may provide ECC bits, and the parity decoder may selectively modify the ECC bits provided to the processing device based on data provided by the memory device and parity bit(s) provided by the memory device.

15 Claims, 6 Drawing Sheets

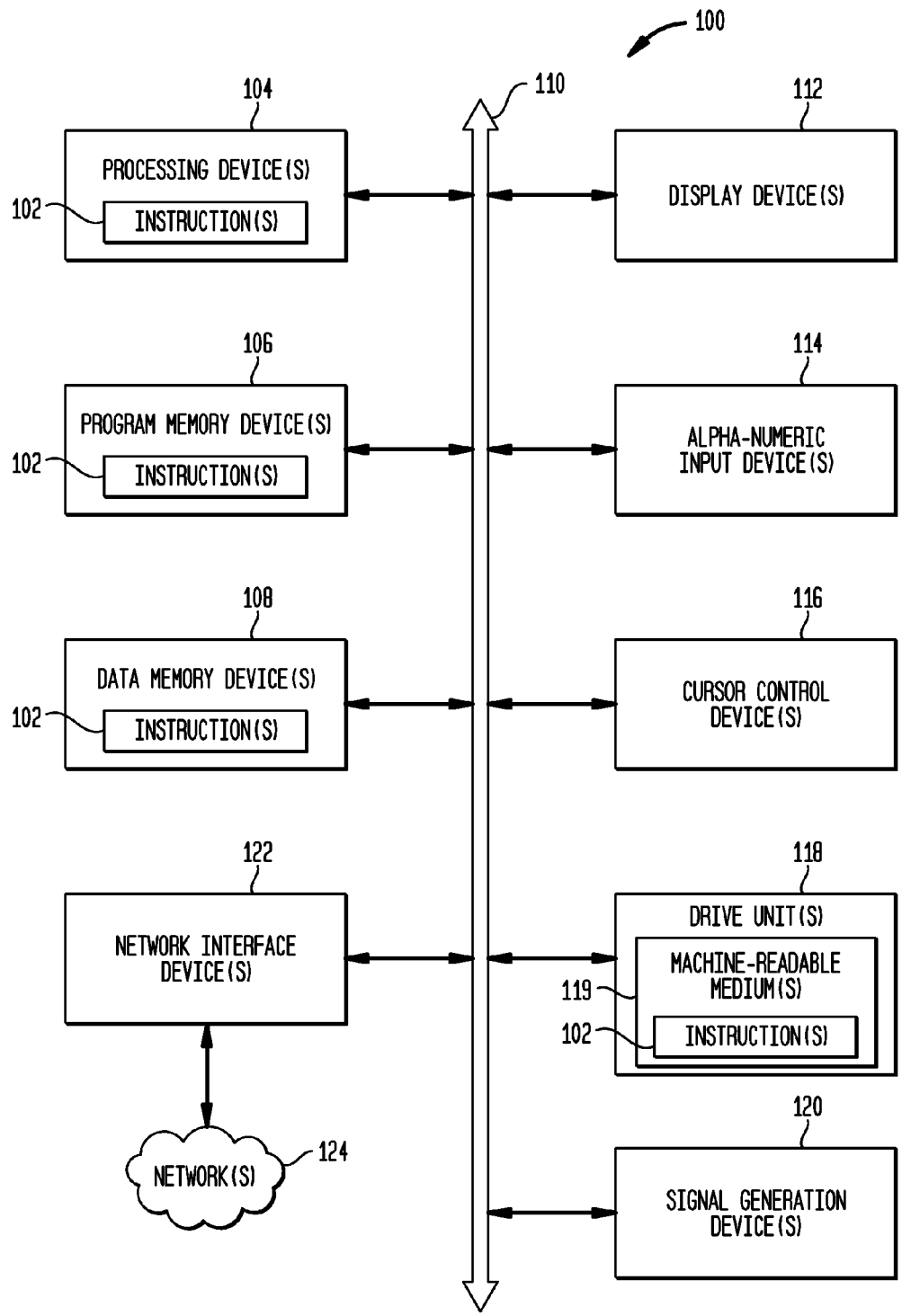

METHOD AND APPARATUS TO REDUCE A
QUANTITY OF ERROR
DETECTION/CORRECTION BITS IN
MEMORY COUPLED TO A
DATA-PROTECTED PROCESSOR PORT

BACKGROUND

1. Field

The present invention relates generally to electrical and electronic devices and circuits, and more particularly relates to data integrity in processor-memory interfaces.

2. Related Art

Conventional sub-micron system-on-a-chip (SoC) product designs typically include a large number of integrated components. These designs also generally include one or more processors or central processing units (CPUs) with associated memory in addition to several other components, which may be product and application specific. However, integrating this memory using sub-micron technology is susceptible to various noise-injection events, such as, alpha particle strikes, and the like that can corrupt contents of the memory resulting in a loss of data integrity and/or system failure. Accordingly, schemes, such as parity and error correcting code (ECC) protection, have been developed to address these failures.

Data integrity schemes, such as parity error protection, are simple and require low overhead, but are only able to detect single-bit failures and are unable to correct detected errors. In comparison to parity error protection, ECC schemes can detect a greater number of errors and can even correct such errors to some extent, depending on the ECC scheme utilized. For example, a single-bit error correction double-bit error detection (SECDED) ECC scheme can detect double-bit errors and correct single-bit errors. However, implementing ECC requires the insertion of additional ECC code bits into each data word, thereby increasing system complexity, overhead, and cost.

If ECC is used and a unit of data or a word is stored in memory, such as random access memory (RAM) or peripheral storage, such as a hard disk drive (HDD), a code that describes the bit sequence in the word is typically calculated and stored along with the word. For example, for each 64-bit word, an additional eight bits of memory are stored to represent the ECC code. When the word is accessed during a read operation, a code for the stored word is again calculated using an ECC algorithm. The newly generated code is compared with the code generated when the word was initially stored and, if the codes match, the data is considered to be valid, and free of errors. When the codes do not match, the erroneous bit or bits are corrected, assuming the number of detected bit errors does not exceed the error correction capability of the ECC scheme employed. For single-bit error correction double-bit error detection code, only single-bit errors can be corrected and double-bit errors can be detected.

Conventionally, an attempt to correct data stored in memory is not made until that data is to be accessed. Eventually, the stored data will be overwritten by new data and, assuming the errors are transient, the incorrect bits will not be an issue. Errors that recur at the same address in memory after the system has been restarted likely indicate a permanent hardware error that may trigger a message to be sent to a log or system administrator providing the address associated with the recurrent error.

The implementation of ECC has become increasingly popular in higher reliability applications, such as data storage and transmission, particularly as data rates, and thus error rates increase. Thus, based on the particular application and prevailing operating conditions, a SoC may require different schemes to ensure data integrity on the same memory interface port.

SUMMARY

The disclosure, in illustrative embodiments thereof, relates to an interface device operative to provide an interface between a processing device configured to provide ECC-based protection and a memory device configured to provide parity-based protection or no error protection at all. To accomplish this, aspects of the disclosed embodiments utilize a parity encoder, an ECC encoder, and a parity decoder depending upon the required protection mechanism of the memory device. In this manner, the disclosed embodiments provide for the ability to mix different memory device types on the same processor memory interface port.

In accordance with an embodiment, an interface device configured to interface between a processing device and a memory device is provided, which includes an ECC encoder configured to calculate at least one ECC bit and provide the at least one ECC bit to the processing device based at least in part on data provided by the memory device, thereby eliminating a need for ECC bits to be stored in the memory device. The interface device may also include a parity encoder configured to provide at least one parity bit to the memory device based on data provided by the processing device, and a parity decoder configured to selectively modify the at least one ECC bit provided to the processing device based on the data provided by the memory device and at least one parity bit provided by the memory device. The processing device may include an ECC-based memory interface port, and may not support a parity-based memory device. The memory device may include a parity-based interface. The ECC encoder may be configured to provide a plurality of ECC bits, and the parity decoder may be configured to selectively modify the plurality of ECC bits provided to the processing device based on the data provided by the memory device and the at least one parity bit provided by the memory device. The processing device may include the ECC encoder. The parity decoder may be configured to invert a plurality of ECC bits to the processing device in response to the data provided by the memory device and the at least one parity bit provided by the memory device indicating an error associated with the data provided by the memory device.

In accordance with another embodiment, a method of interfacing between a processing device and a memory device is provided, which includes calculating at least one ECC bit and providing the at least one ECC bit to the processing device based at least in part on data provided by the memory device, thereby eliminating a need for ECC bits to be stored in the memory device.

The method may also include providing at least one parity bit to the memory device based on data provided by the processing device, and selectively modifying the at least one ECC bit provided to the processing device based at least in part on the data provided by the memory device and at least one parity bit provided by the memory device. The processing device may include an ECC-based memory interface port, and may not support a parity-based memory device. The memory device may include a parity-based interface. The method may also include providing a plurality of ECC bits, and selectively modifying the plurality of ECC bits provided to the processing device as a function of the data provided by the memory device and the at least one parity bit provided by the memory device. Providing at least one ECC bit based on data provided by the memory device may be performed by the processing device, and the method may include inverting a plurality of ECC bits to the processing device in response to the data provided by the memory device and the at least one parity bit provided by the memory device indicating an error associated with the data provided by the memory device.

In accordance with yet another embodiment, a computer-readable medium including instructions that, when executed by a processing device, cause the processing device to perform a computer process is provided, which includes calculating at least one ECC bit based at least in part on data provided by the memory device and providing the at least one ECC bit to the processing device, thereby eliminating a need to store the at least one ECC bit in the memory device.

The computer process may include providing at least one parity bit to the memory device as a function of data provided by the processing device, and selectively modifying the at least one ECC bit provided to the processing device based at least in part on the data provided by the memory device and at least one parity bit provided by the memory device. The processing device may include an ECC-based memory interface port, and may not support a parity-based memory device. The memory device may include a parity-based interface. The computer process may include providing a plurality of ECC bits, and selectively modifying the plurality of ECC bits to the processing device as a function of the data provided by the memory device and the at least one parity bit provided by the memory device. Providing at least one ECC bit based at least in part on data provided by the memory device may be performed by the processing device, and the computer process may include inverting a plurality of ECC bits to the processing device in response to the data provided by the memory device and the at least one parity bit provided by the memory device indicating an error associated with the data provided by the memory device.

These and other features, objects, and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 6 is a block diagram of an embodiment of a machine in the form of a computing system configured to perform the disclosed methods.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments disclosed herein will be described in the context of illustrative data integrity and error management methods, as well as controllers configured to interface between processing devices and memory devices. It should be understood, however, that the disclosed embodiments are not limited to these or any other particular circuit arrangements. Rather, the embodiments are more generally applicable to techniques for improving data integrity in memory systems while beneficially reducing additional area and power consumption ordinarily required to implement non-essential data integrity techniques associated with specified memory types, among other advantages. Moreover, it will become apparent to those skilled in the art given the teachings herein that numerous modifications can be made to the embodiments described while remaining within the scope of the disclosure. That is, no limitations with respect to the specific embodiments described herein are intended or should be inferred.

In recognition of the trend towards greater data integrity, newer generation processors offer memory interfaces that enable the use of error detection/correction (EDC) schemes. These processors can internally implement an ECC/parity encoder on the data write path and ECC/parity checking on the data read path. Thus, there is generally no need to implement external error coding/decoding logic. However, the same memory interface may be shared among various types of memories, such as random access memory (RAM), dual-port ram (DPRAM), and read-only memory (ROM), which differ substantially in their need for data integrity protection. In addition, one memory interface can usually support only one type of error detection/correction scheme, such as no error checking, parity-only checking, or ECC-only checking, thus mandating that all memory devices on the same interface port use the same error protection scheme. Further, some processors, such as the ARM® Cortex™-R5 processor (available from ARM Inc., 150 Rose Orchard Way, San Jose, Calif. 95134-1358), do not support all error protection schemes, such as parity, on one or more memory interface ports. Due to such limitations, it may not be possible to implement multiple memory configurations on the same port.

Figure 1:
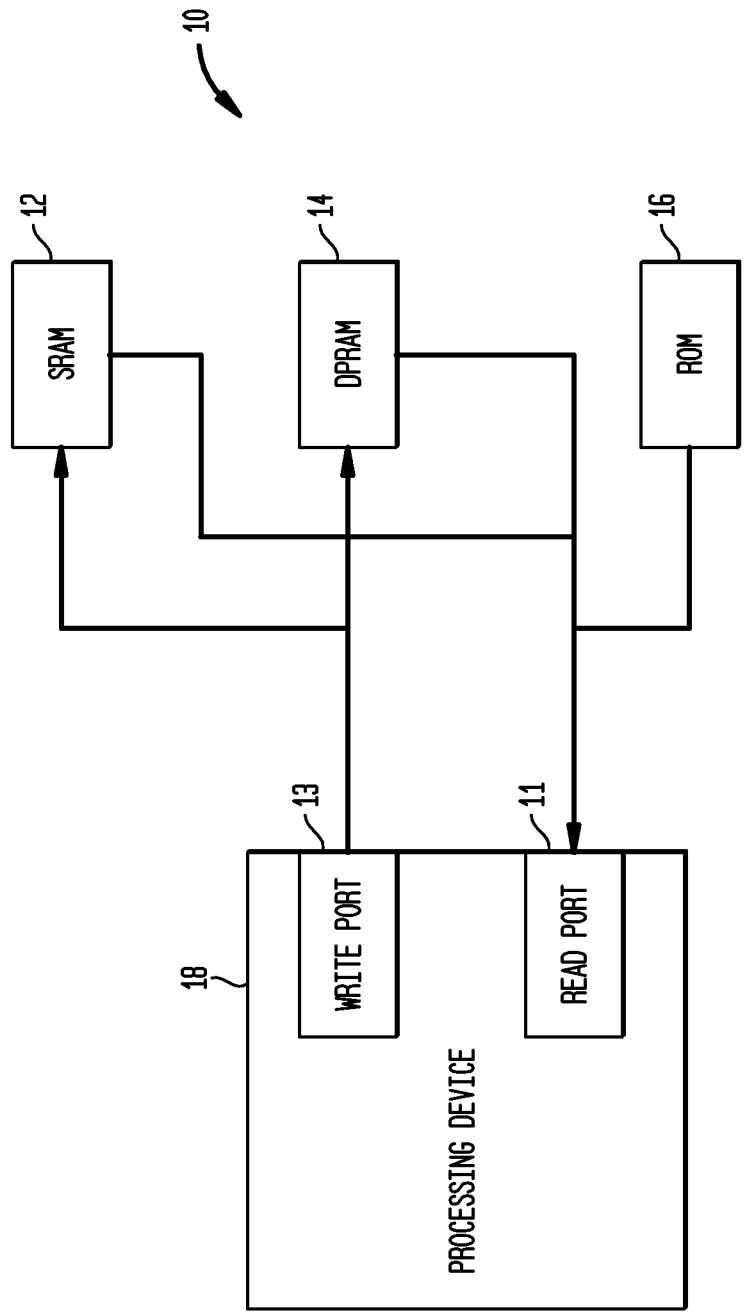
FIG. 1 is a block diagram showing a processor-memory interface including various types of memory connected to a bi-directional port without implementation of a data integrity scheme.

FIG. 1 is a block diagram showing at least a portion of a processor-memory interface 10 including various types of memory operatively coupled to a bi-directional port without implementation of a data integrity scheme. The processor-memory interface 10 includes a processor 18 and three different types of memory devices, including a static RAM (SRAM) 12, a dual-port RAM (DPRAM) 14, and a read-only memory (ROM) 16. The processor 18 interfaces to the memory devices 12, 14, 16 through a memory read port 11 and a memory write port 13. The memory read port 11 is operatively coupled to the SRAM 12, DPRAM 14, and ROM 16, and the memory write port 13 is operatively coupled to the SRAM 12 and DPRAM 14. In a particular application, the interface 10 shown in FIG. 1 may require that the SRAM 12 be implemented with ECC-based error protection, DPRAM 14 be implemented with parity-based protection, and ROM 16 be implemented without any memory protection.

Figure 2:
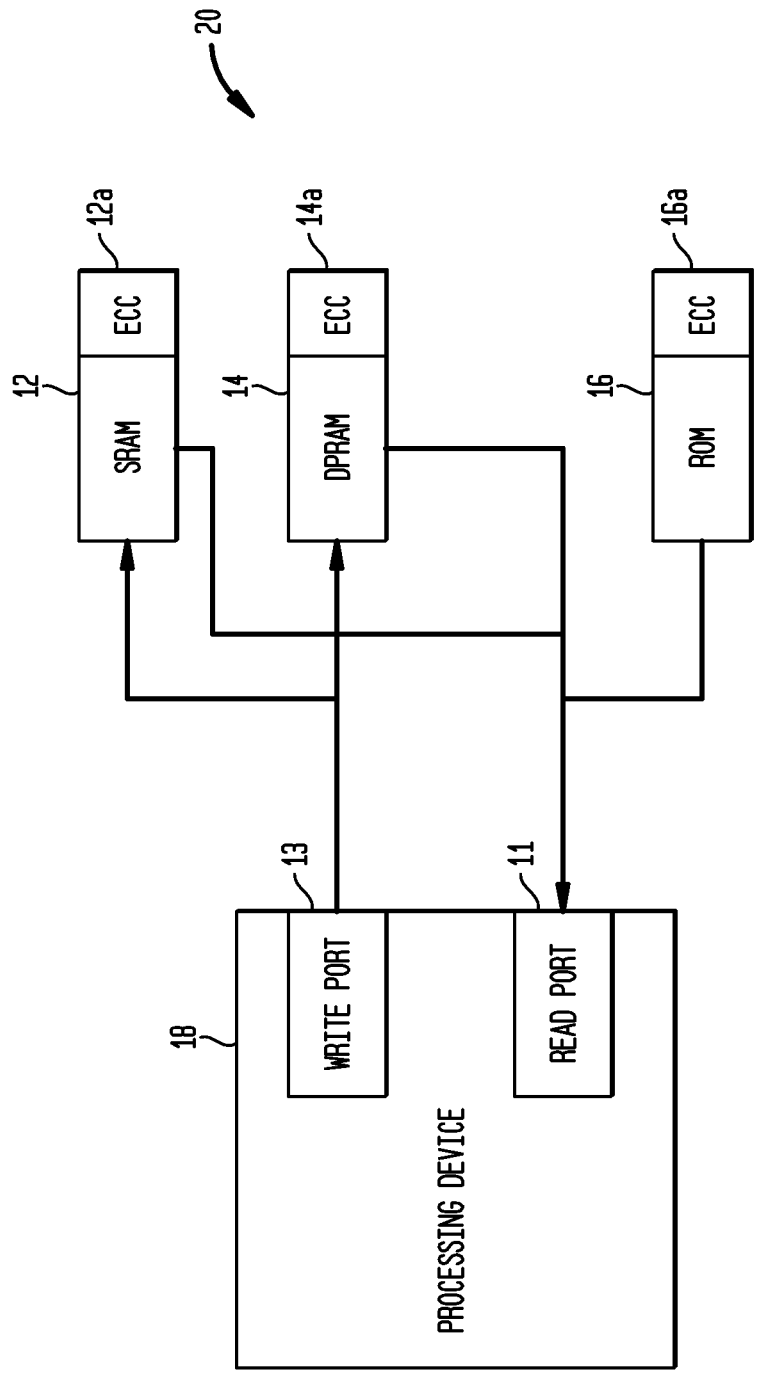
FIG. 2 is a block diagram showing the processor-memory interface of FIG. 1 including an implementation of an error correcting code (ECC)-based data integrity scheme.

One approach to diversifying the type of memory protection schemes provided to various memory device types on the same processor-memory interface results in the implementation shown in FIG. 2, which shows at least a portion of another illustrative processor-memory interface 20. Processor-memory interface 20 includes processor 18, which is configured for ECC-based memory protection on the interface 20 shown, and requires that each of the different types of memory, SRAM 12, DPRAM 14, and ROM 16 coupled to the processor 18 (on the same interface port) implement the same ECC-based protection scheme.

In a manner consistent with the processor-memory interface 10 shown in FIG. 1, the memory read port 11 in FIG. 2 is operatively coupled with SRAM 12, DPRAM 14, and ROM 16, and the memory write port 13 is operatively coupled with SRAM 12 and DPRAM 14. However, in contrast to the processor-memory interface 10 shown in FIG. 1, the approach shown in FIG. 2 also requires that the SRAM 12, DPRAM 14, and ROM 16 be implemented with additional storage space, 12a, 14a, and 16a, respectively, which is operative to store the corresponding ECC code bits used to implement the ECC-based protection scheme for each memory device type. As a result, this approach uses substantially greater board and/or chip real estate, as well as power that would otherwise not be necessary for certain memory device types, such as ROM. Further, lengthening the width of memory devices to accommodate the additional ECC code bits places additional constraints on memory timing, thus degrading overall system performance.

As discussed above, if the processor 18 provides for ECC- and/or parity-based protection schemes on a port that is shared with various memory types, such as SRAM 12, DPRAM 14, and ROM 16, the processor, using a standard processor-memory interface approach, will generally support only one type of memory protection for all memory device types connected to the same port, including ROM. However, providing error correction/protection for ROM is unnecessary since its contents are fixed upon programming and generally cannot be changed under program (software/firmware) control. Thus, since selective disabling of memory protection for different memory devices on the same port is generally not possible with conventional processors, data detection/correction must also extend to ROM, which results in a substantial waste of area, power, and performance. In addition, since processors cannot ordinarily correct soft errors resulting from ROM periphery logic by writing back a corrected memory value, firmware must account for this deficiency, which results in further system overhead and performance degradation.

Memory protection schemes are primarily intended for re-writable memories, such as, but not limited to, SRAM and DPRAM, since the probability of the contents of these types of memories being corrupted is far greater when compared to ROM. However, if ROM is connected to a data port configured for memory protection, extra bits of the ROM are conventionally reserved for ECC bits since the same memory protection scheme is conventionally applied to all memory devices, including ROM, on the same port. Since ROM content cannot generally be corrupted or changed under program control, the additional storage space 16a reserved for ECC bits in ROM represents a substantial waste of area, power, and performance.

DPRAM may also require only parity-based protection due to an expectation of lower software error rates or that data in DPRAM is not typically considered critical enough to warrant ECC-based protection. However, the conventional approach is to force ECC-based protection to be used for DPRAM as well, thus requiring additional memory space to store the corresponding ECC bits with a corresponding waste of area, power, and performance.

The embodiments disclosed herein relate to methods and apparatus for use with memory devices that do not implement error protection schemes, or that provide for parity-based protection, in conjunction with processors that do not support parity-based protection, but support ECC-based protection on their memory interfaces, among other beneficial applications. These embodiments are advantageous when different types of memory protection schemes are required on a single memory interface of the processor.

Techniques for eliminating the requirement of having additional ECC/parity bits associated with ROM and connecting the ROM to a data protected port are disclosed herein. In these embodiments, the storage area for redundant ECC/parity data in ROM is eliminated by using pre-existing ECC/parity read logic. This technique advantageously results in significant reductions in area and power requirements compared to conventional error protection approaches.

The disclosed embodiments also ensure that the processor response to errors is the same in all memory protection schemes. Yet further, these embodiments may enable the use of ECC decoding logic in the processor, which generally provides additional features, such as error status logging, identification of the address associated with the error, and the like, which can be useful when dealing with parity errors, as well as 32-bit ECC, 64-bit ECC, or no ECC. It is to be appreciated, however, that the disclosed embodiments are not limited to being used with any specific ECC scheme.

In addition, there is no requirement in the disclosed embodiments to connect ROM to a non-data-protected port or to connect RAM to a separate data protected port, since both types of memory are able to share the same data protected port without additional overhead and/or reduced performance. For example, assume that ROM is organized with a 32-bit width and has an access time of 1.0 ns. If parity is required for this ROM, the ROM may require 33 bits (32 bits plus 1 parity bit), and thus the ROM access time may increase to, for example, 1.1 ns. Similarly, if the same ROM requires 32-bit ECC, the width of the ROM becomes 39 bits (32 bits plus 7 ECC bits). This may result in the ROM access time becoming 1.3 ns. Thus, additional memory width and/or area can significantly degrade the performance of the resulting memory system.

In addition, ROM data parameters are significantly improved by utilizing the disclosed embodiments in terms of timing, area, leakage power, pin power, and the like, since these data parameters are optimized for standard power-of-two memory systems as compared with non-power-of-two memory systems. Further, ROM does not generally exhibit soft-error issues, and thus ECC-based error protection is not often considered as being required for ROM. Even if an error occurs in ROM, the error cannot generally be overwritten under program (firmware) control as can be done if the error occurs in SRAM.

Generally, Hamming code is used for error correction or detection. In the Hamming code, k ECC bits are added to an n-bit data word to form a new word of n+k bits. The bit positions are numbered in sequence from 1 to n+k. Those positions numbered with powers of two are reserved for the parity bits. The remaining bits are the data bits. Hamming code can be used with words of any length. Thus, bit positions 7, 6, 5, 4, 3, 2, and 1 correspond to D4, D3, D2, P3, D1, P2, and P1, in which D represents the corresponding data bit and P represents the corresponding ECC bit. The three (3) ECC bits, P1 through P3, are in bit positions 1, 2, and 4, respectively. The 4 bits of the data word occupy the remaining bit positions.

For example, a 4-bit data word 0101 with three (3) parity bits is represented in Table 1 as follows:

TABLE 1

| Bit position | 7 | 6 | 5 | 4 | 3 | 2 | 1 |
|---|---|---|---|---|---|---|---|
| Data | 0 | 1 | 0 | | 1 | | |
| ECC | | | | 1 | | 0 | 1 |
| Data + ECC | 0 | 1 | 0 | 1 | 1 | 0 | 1 |

Each parity bit is calculated as follows:

$$P1 = XOR(D7, D5, D3); \quad (1)$$
$$= 0 \oplus 0 \oplus 1$$
$$= 1$$

$$P2 = XOR(D7, D6, D3); \quad (2)$$
$$= 0 \oplus 1 \oplus 1$$
$$= 0$$

and $$P3 = XOR(D7, D6, D5) \quad (3)$$
$$= 0 \oplus 1 + 0$$
$$= 1.$$

The XOR (exclusive-OR) operation performs the odd function, which results in 1 for an odd number of 1's as input variables and results in 0 for an even number of 1's as input variables.

The 4-bit data word is written to memory with the three (3) ECC bits as a 7-bit composite word. When the 7 bits are read from memory, the bits are checked again for errors.

The parity of the word is checked over the same groups of bits, including their ECC bits. The three check bits are calculated as follows:

$$C1 = XOR(D1, D3, D5, D7); \quad (4)$$

$$C2 = XOR(D2, D3, D6, D7); \text{ and} \quad (5)$$

$$C4 = XOR(D4, D5, D6, D7). \quad (6)$$

The result, C4 C2 C1=000, indicates that no error has occurred. However, if C≠0, the 3-bit binary number formed by the check bits represents the position of the erroneous bit if only a single bit is in error.

For example, consider the following three cases in Table 2:

TABLE 2

| Bit position | 7 | 6 | 5 | 4 | 3 | 2 | 1 | Result |
|---|---|---|---|---|---|---|---|---|
| Data + ECC | 0 | 1 | 0 | 1 | 1 | 0 | 1 | No error |
| Data + ECC | 0 | 1 | 0 | 1 | 1 | 0 | 0 | Error in bit 1 |
| Data + ECC | 0 | 1 | 1 | 1 | 1 | 0 | 1 | Error in bit 5 |

In the first case, there is no error in the 7-bit word. In the second case, there is an error in bit position number 1 because this bit changed from 0 to 1. The third case shows an error in bit position 5 with a change from 1 to 0. By evaluating the XOR of the corresponding bits, the four check bits are in Table 3 as follows:

TABLE 3

| ECC bit position | C4 | C2 | C1 |
|---|---|---|---|
| No error | 0 | 0 | 0 |
| Error in bit 1 | 0 | 0 | 1 |
| Error in bit 5 | 1 | 0 | 1 |

The error can then be corrected by complementing the corresponding bit. Note that an error can occur in the data or in one of the ECC bits.

Assuming an 8-bit wide ROM with 4-bit data (nibble) and contents equal to 2, 5, 9, 6, 7, D, A, C, the ECC bits can be pre-calculated and burned into the ROM as shown in Table 4 below.

TABLE 4

| | | | | | | |
|---|---|---|---|---|---|---|
| 0 | 0 | 1 | 1 | 0 | 0 | 1 |
| 0 | 1 | 0 | 1 | 1 | 0 | 1 |
| 1 | 0 | 0 | 1 | 1 | 0 | 0 |
| 0 | 1 | 1 | 0 | 0 | 1 | 1 |
| 0 | 1 | 1 | 0 | 1 | 0 | 1 |
| 1 | 1 | 0 | 0 | 1 | 1 | 0 |
| 1 | 0 | 1 | 0 | 0 | 1 | 0 |
| 1 | 1 | 0 | 0 | 0 | 0 | 1 |

Bits 1, 2, and 4 are ECC bits and the remaining bits are data bits. However, external wiring can be modified to re-organize the ROM upon being read back as shown below in Table 5.

TABLE 5

| | | | | | | |
|---|---|---|---|---|---|---|
| 0 | 0 | 1 | 0 | 1 | 0 | 1 |
| 0 | 1 | 0 | 1 | 1 | 0 | 1 |
| 1 | 0 | 0 | 1 | 1 | 0 | 0 |
| 0 | 1 | 1 | 0 | 0 | 1 | 1 |
| 0 | 1 | 1 | 1 | 0 | 0 | 0 |
| 1 | 1 | 0 | 1 | 0 | 1 | 0 |
| 1 | 0 | 1 | 0 | 0 | 1 | 0 |
| 1 | 1 | 0 | 0 | 0 | 0 | 1 |

Figure 3:
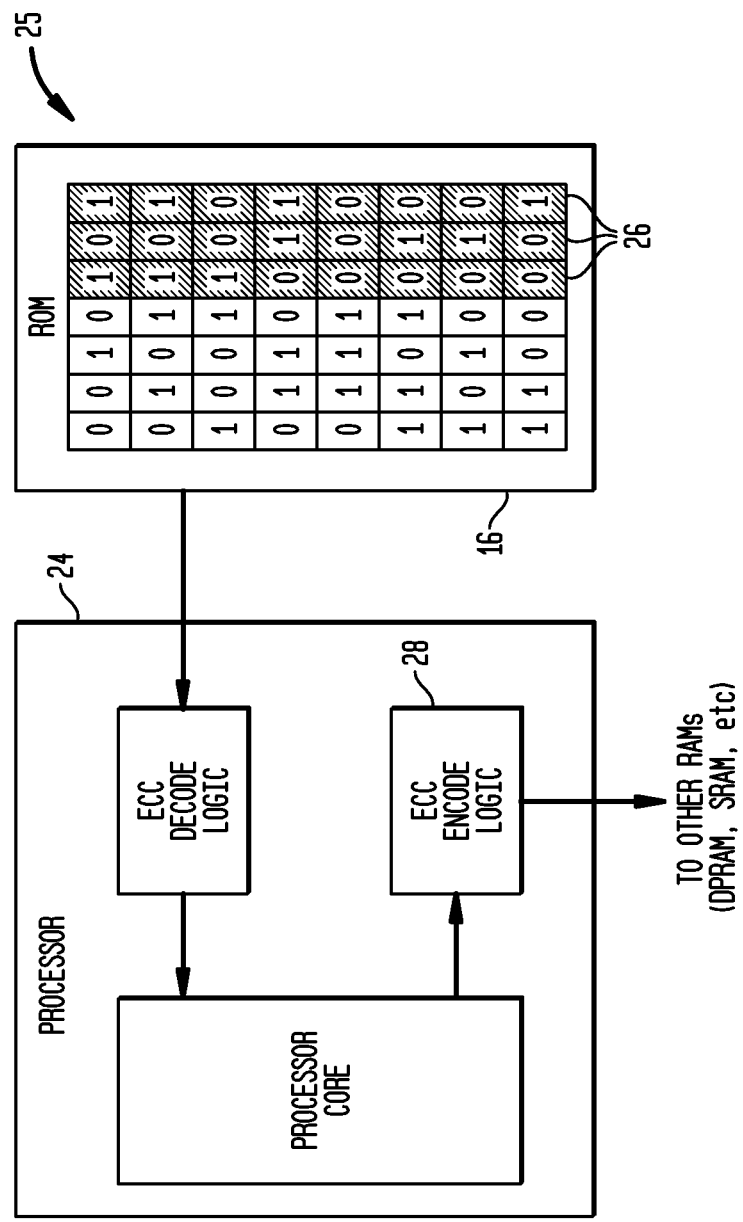
FIG. 3 is a block diagram showing a processor-memory interface having ECC-based protection.
Figure 4:
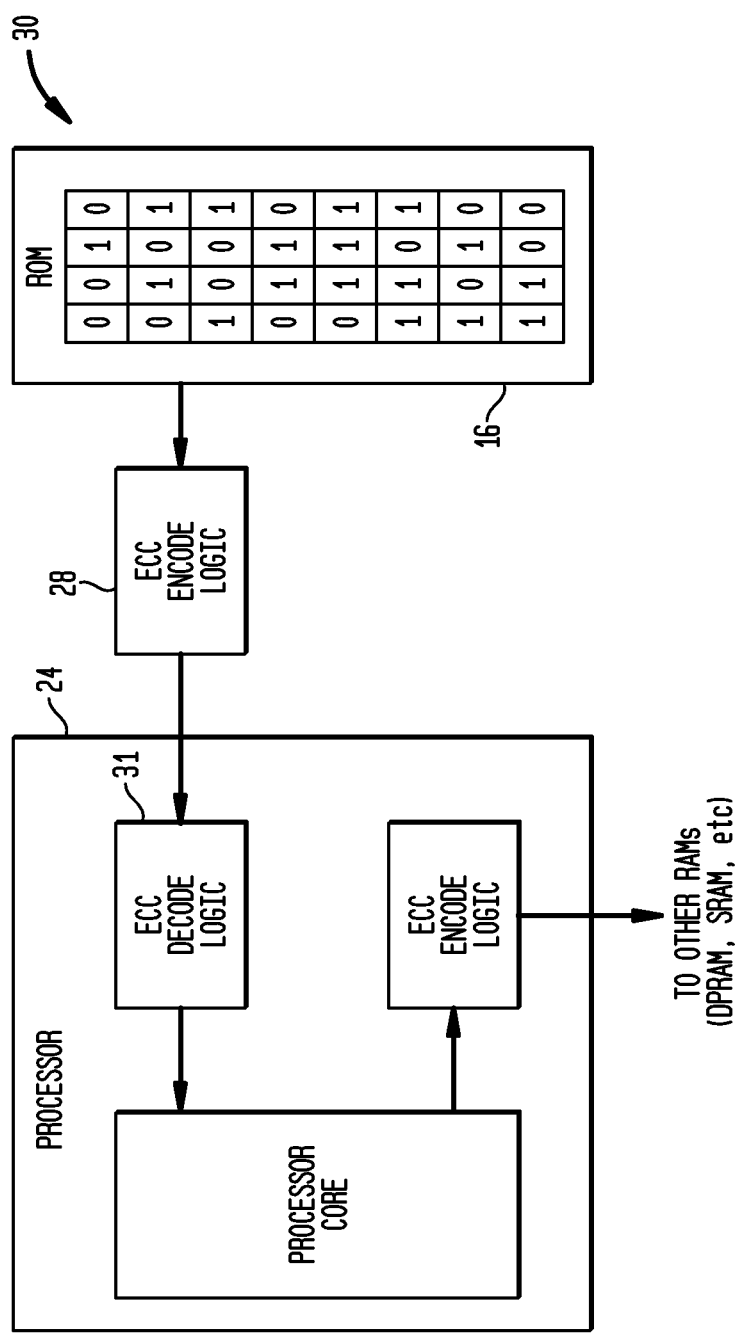
FIG. 4 is a block diagram showing a processor-memory interface in accordance with a first disclosed embodiment.

Such a ROM may be interfaced to the processor as shown in FIG. 3. FIG. 3 is a block diagram showing at least a portion of an exemplary processor-memory interface 25, according to an embodiment of the invention. As apparent from the figure, processor-memory interface 25 includes a processor 24 coupled to a ROM 16. ECC check logic 28 in the processor 24 verifies the accuracy of ECC bits read from other types of memory, such as SRAM and DPRAM (not shown). The ECC bits are calculated and stored in ROM 16, and are later read out during ROM read accesses However, the ROM ECC bits 26 can be shaved-off or eliminated if the ECC bits are calculated on the fly using the ECC check logic 31 internal to the processor 24. Such a processor-memory interface 30 is shown in FIG. 4. The Hamming code can be used for data words of any length. Typically, processor data widths are 32 bits, 64 bits, and the like.

The processor-memory interface 30 uses ECC encode logic 28 to calculate an ECC value during ROM read accesses. Accordingly, the ROM 16 can provide read data without ECC/parity bits, which saves additional ROM bits 26 shown in FIG. 3 (also shown as being omitted in FIG. 4) that would otherwise have been necessary to implement the ECC-based data integrity scheme shown in FIG. 2. Since the processor 24 is configured for ECC-based protection, the processor 24 will expect the correct ECC value during read accesses from memory on the same port including ROM 16 read accesses.

Figure 5:
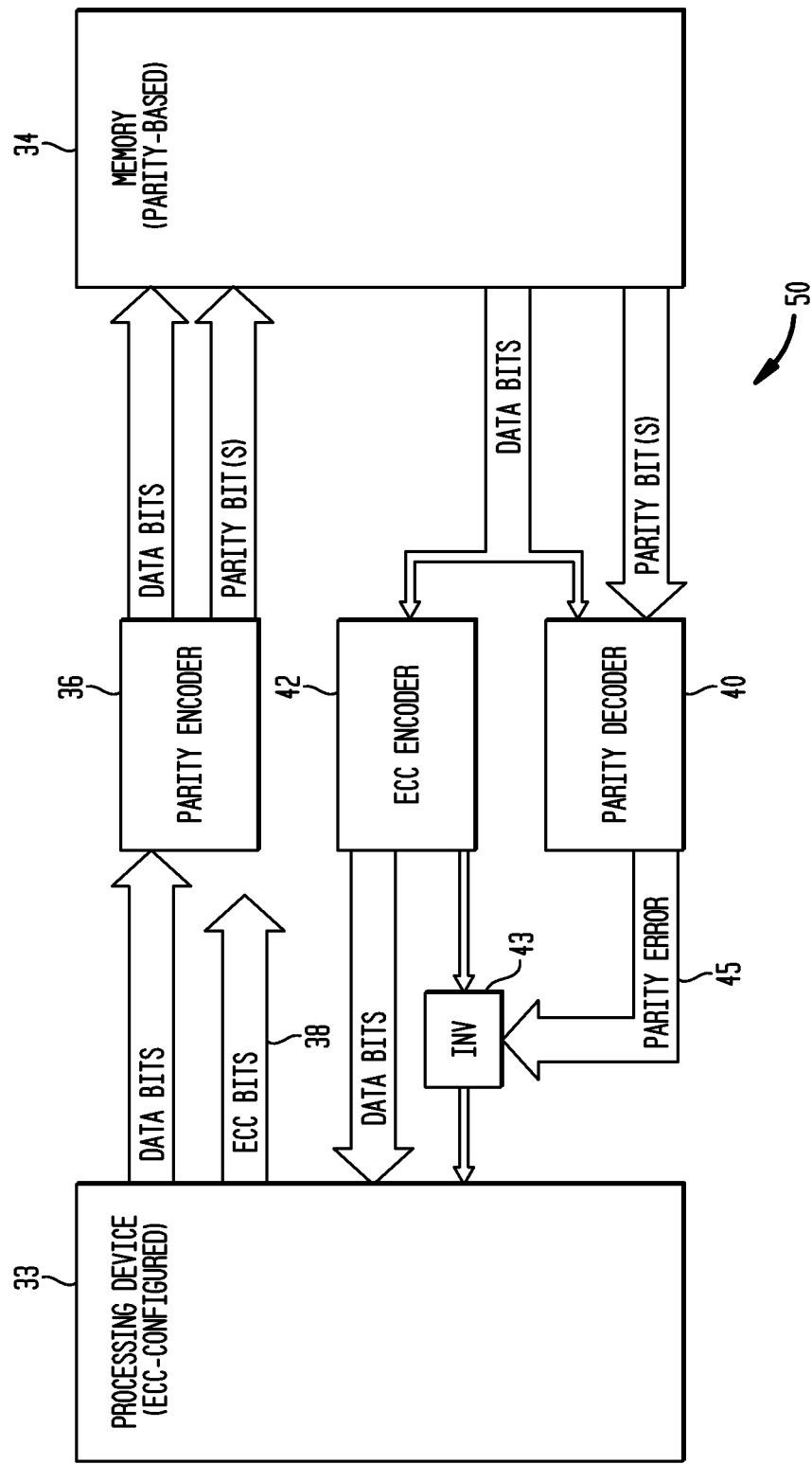
FIG. 5 is a block diagram showing a processor-memory interface in accordance with a second disclosed embodiment.

For read accesses from SRAM or DPRAM, the ECC bits may be obtained from the respective memory device. For read accesses from ROM 16 shown in FIG. 4, which is configured for no error detection/correction, the ECC value can be calculated using the ECC encode logic 28 external to the processor 24 and provided to ECC decode logic 31 internal to the processor 24 for verification. That is, the processor 24 includes ECC decode logic 31 that confirms ECC values calculated by the ECC encode logic 28 during operation of the processor 24. The data bits read from ROM 16 are provided to the ECC encode logic 28 external to the processor 24, which calculates the ECC bits and provides the data bits read from ROM 16 with the calculated ECC bits in the read path of the processor 24 via the ECC decode logic 31. Thus, rather than storing the pre-calculated ECC bits in ROM, the ECC bit values are calculated during operation, and the processor 24 obtains the data with the calculated ECC bits. This results in a substantial reduction in wasted space, power, and performance due to a significant reduction in the size of ROM 16. Alternatively, the ECC encode logic 28 may be duplicated or re-used external to the processor 24 as shown in FIG. 5, while maintaining significant area and power savings. The ECC encoder for ROM read accesses may alternatively be implemented using resources internal, rather than external, to the processor 24.

Table 6 illustrates that a 17% savings in area and a 14% savings in leakage power is provided upon implementation of the embodiment shown in FIG. 4 using a 64 kB ROM.

TABLE 6

| | Device Identification | Width | Depth | Area (mm$^2$) | Dynamic Power (mW/MHz) | Leakage Power (mW) |
|---|---|---|---|---|---|---|
| With ECC bits | RRVROMPVI6384MI6X40B4HS | 40 | 16K | 0.03555 | 5.0e−3 | 4.3 |
| Without ECC bits | RRVROMPVI6384MI6X32B4HS | 32 | 16K | 0.029372 | 4.2e−3 | 3.7 |

The error correction code may be parity- and/or ECC-based. If the code to be used is a parity-based error correction code, one (1) additional bit is used to represent parity. If there is a 32-bit data width, seven (7) additional bits are used to represent 7-bit ECC. If there is a 64-bit data width, nine (9) additional redundant bits are used to represent 9-bit ECC. Generally, data is organized as n multiple of 1 byte (8 bits). Moreover, memory devices are predominantly organized in widths equal to an integer power of two. Thus, if additional error code bits (either parity and/or ECC) are to be added, the memory width will become odd and/or a non-integer power of two. As a result, the architecture of the memory system will include non-power of two memory devices, and the resulting memory system will be far less than optimal A second embodiment of a processor-memory interface 50 is shown in FIG. 5, which includes a processing device (e.g., processor) 33 having a memory interface port configured for ECC-based protection, logic inserted in both read and write paths to interface with memory 34 using parity protection (parity encoder 36 and parity decoder 40), logic to insert error bits into the ECC read path such that a parity error is recognized by the processor 33 (ECC encoder 42 and ECC bit inverter 43), and firmware (not explicitly shown) that recognizes the ECC-based error as a parity error in response to the memory 34 being accessed.

As shown in FIG. 5, the write path for memory 34 using parity includes the parity encoder 36. The parity encoder 36 calculates parity bits for data being written by the processor 33 to memory 34. The parity value calculated by the parity encoder 36 is written with the data into the parity-based memory 34. ECC bits 38 from the processor 33 write port are ignored since memory 34 only supports parity protection. Thus, if 32-bit data plus 1-bit parity is implemented rather than 32-bit data plus 7-bit ECC, the memory width is only 33 bits rather than 39 bits, which represents a substantial saving in area, power, and performance. For example, assuming a 64 KB memory device, the area and power consumption required for an additional 384K bits (64×1024×6 bits) would be saved assuming byte parity, and 12K bits (2×1024×6 bits) would be saved assuming 32-bit parity.

For read accesses, the read path includes the parity decoder 40, the ECC encoder 42, and the ECC bit inverter 43. The ECC encoder 42 calculates ECC bits based on data that is read from memory 34 without using parity bits provided by memory 34. The parity decoder 40 checks the data and parity bits for the presence of parity errors. If the parity decoder 40 detects a parity error, the parity decoder 40 outputs a parity error signal 45 to the ECC bit inverter 43, which causes the ECC bit inverter 43 to invert two (2) bits of the ECC bits calculated by the ECC encoder 42. This results in a double-bit (uncorrectable) error being generated in response to the processing device 33 decoding the inverted ECC bits. Thus, a read access error is generated that is handled by the processing device 33 through firmware, which preferably treats this error as a parity error and takes the appropriate action.

If the parity decoder 40 does not detect an error, the parity decoder 40 outputs the parity error signal 45 to the ECC bit inverter 43 such that the ECC bit inverter 43 does not invert the ECC bits calculated by the ECC encoder 42, and the calculated ECC bits are passed on to the processing device 33 without inversion, thereby avoiding recognition of an ECC error by the processing device 33. The ECC bit inverter 43 is implemented, for example using XOR (exclusive-OR) gates. The parity encoder 36, ECC encoder 42, and parity decoder 40 may be implemented by means known in the art, such as by utilizing logic gates configured to perform the disclosed functions.

Thus, the proposed invention may be advantageously used to (1) support parity-based memory operatively coupled to processor interfaces that do not support parity-based protection or that provide no error protection at all; (2) reduce area and power requirements; (3) relieve timing constraints; and (4) support multiple error correction/detection schemes on the same processor interface port without compromising processor behavior or incorporating ECC on all memory devices of the same port.

FIG. 6 is a block diagram of an embodiment of a machine in the form of a computing system 100, within which a set of instructions 102, that, when executed, may cause the machine to perform any one or more of the methodologies disclosed herein. In some embodiments, the machine operates as a standalone device. In some embodiments, the machine may be connected (e.g., via a network 124) to other machines. In a networked implementation, the machine may operate in the capacity of a server or a client user machine in a server-client user network environment. The machine may comprise a server computer, a client user computer, a personal computer (PC), a tablet PC, a Personal Digital Assistant (PDA), a cellular telephone, a mobile device, a palmtop computer, a laptop computer, a desktop computer, a communication device, a personal trusted device, a web appliance, a network router, a switch or bridge, or any machine capable of executing a set of instructions (sequential or otherwise) that specify actions to be taken by that machine.

The computing system 100 may include a processing device(s) 104 (e.g., a central processing unit (CPU), a graphics processing unit (GPU), or both), program memory device(s) 106, and data memory device(s) 108, which communicate with each other via a bus 110. The computing system 100 may further include display device(s) 112 (e.g., liquid crystals display (LCD), a flat panel, a solid state display, or a cathode ray tube (CRT)). The computing system 100 may include input device(s) 114 (e.g., a keyboard), cursor control device(s) 116 (e.g., a mouse), disk drive unit(s) 118, signal generation device(s) 120 (e.g., a speaker or remote control), and network interface device(s) 122, operatively coupled together, and/or with other functional blocks, via bus 110.

The disk drive unit(s) 118 may include machine-readable medium(s) 119, on which is stored one or more sets of instructions 102 (e.g., software) embodying any one or more of the methodologies or functions disclosed herein, including those methods illustrated herein. The instructions 102 may also reside, completely or at least partially, within the program memory device(s) 106, the data memory device(s) 108, and/or the processing device(s) 104 during execution thereof by the computing system 100. The program memory device(s) 106 and the processing device(s) 104 may also constitute machine-readable media. Dedicated hardware implementations, such as but not limited to application specific integrated circuits, programmable logic arrays, and other hardware devices can likewise be constructed to implement the methods described herein. Applications that may include the apparatus and systems of various embodiments broadly comprise a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments, the methods, functions or logic described herein may be implemented as one or more software programs running on a computer processor. Dedicated hardware implementations including, but not limited to, application specific integrated circuits, programmable logic arrays and other hardware devices can likewise be constructed to implement the methods described herein. Furthermore, alternative software implementations including, but not limited to, distributed processing or component/object distributed processing, parallel processing, or virtual machine processing can also be constructed to implement the methods, functions or logic described herein.

The present embodiment contemplates a machine-readable medium or computer-readable medium containing instructions 102, or that which receives and executes instructions 102 from a propagated signal so that a device connected to a network environment 124 can send or receive voice, video or data, and to communicate over the network 124 using the instructions 102. The instructions 102 may further be transmitted or received over the network 124 via the network interface device(s) 122. The machine-readable medium may also contain a data structure for storing data useful in providing a functional relationship between the data and a machine or computer in an illustrative embodiment of the disclosed systems and methods.

While the machine-readable medium 102 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the present embodiment. The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the disclosed methods, functions or logic, may optionally be stored on a tangible storage medium, such as: a magnetic medium, such as a disk or tape; a magneto-optical or optical medium, such as a disk; or a solid state medium, such as a memory card or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein may be stored.

Although the present specification describes components and functions implemented in the illustrated embodiments with reference to particular standards and/or protocols, it is to be understood that the disclosed embodiments are not limited to such standards and/or protocols.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived there from, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "embodiment" merely for convenience and without intending to voluntarily limit the scope of this application to any single embodiment or inventive concept if more than one is in fact disclosed. Thus, although specific embodiments have been illustrated and described herein, it should be appreciated that any arrangement calculated to achieve the same or substantially similar purpose may be substituted for the specific embodiments shown. This disclosure is intended to cover any and all adaptations or variations of various embodiments. Combinations of the above embodiments, and other embodiments not specifically described herein, will become apparent to those of skill in the art given the teachings herein.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the appended claims reflect, inventive subject matter lies in less than all features of a single disclosed embodiment. Thus the following claims are hereby incorporated into the Detailed Description, with each claim standing on its own as a separate example embodiment.

The Abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as separately claimed subject matter.

Although specific example embodiments have been described, it will be evident that various modifications and changes may be made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Given the teachings of the invention provided herein, one of ordinary skill in the art will be able to contemplate other implementations and applications of the techniques of the invention. Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An interface device configured to interface between a processing device and a memory device, the interface device comprising;
    an error correcting code (ECC) encoder, the ECC encoder calculating at least one ECC bit and providing the at least one ECC bit to the processing device based at least in part on data provided by the memory device, the processing device comprising an ECC-based memory interface port, thereby eliminating a need to store the at least one ECC bit in the memory device;
    a parity encoder, the parity encoder providing at least one parity bit to the memory device based on data provided by the processing device while ignoring at least one ECC bit provided by said processing device; and
    a parity decoder, the parity decoder selectively modifying the at least one ECC bit provided to the processing device based on the data provided by the memory device and at least one parity bit provided by the memory device, the parity decoder inverting a plurality of ECC bits to the processing device in response to the data provided by the memory device and the at least one parity bit provided by the memory device indicating an error associated with the data provided by the memory device.

2. The interface device defined by claim 1, wherein the processing device does not support a parity-based memory device.

3. The interface device defined by claim 1, wherein the memory device comprises at least one of a parity-based interface and an interface not requiring any error or parity-based protection.

4. The interface device defined by claim 1, wherein the ECC encoder is configured to provide a plurality of ECC bits, the parity decoder being configured to selectively modify the plurality of ECC bits provided to the processing device as a function of the data provided by the memory device and the at least one parity bit provided by the memory device.

5. The interface device defined by claim 1, wherein the processing device comprises the ECC encoder.

6. A method of interfacing between a processing device and a memory device, the method comprising;
    calculating at least one error correcting code (ECC) bit and providing the at least one ECC bit to the processing device based at least in part on data provided by the memory device, the processing device comprising an ECC-based memory interface port, thereby eliminating a need to store the at least one ECC bit in the memory device;
    providing at least one parity bit to the memory device as a function of data provided by the processing device while ignoring at least one ECC bit provided by said processing device;
    selectively modifying the at least one ECC bit provided to the processing device based on the data provided by the memory device and at least one parity bit provided by the memory device; and
    inverting a plurality of ECC bits to the processing device in response to the data provided by the memory device and the at least one parity bit provided by the memory device indicating an error associated with the data provided by the memory device.

7. The method defined by claim 6, wherein the processing device does not support a parity-based memory device.

8. The method defined by claim 6, wherein the memory device comprises at least one of a parity-based interface and an interface not requiring any error or parity-based protection.

9. The method defined by claim 6, further comprising;
providing a plurality of ECC bits; and
modifying selectively the plurality of ECC bits provided to the processing device based on the data provided by the memory device and the at least one parity bit provided by the memory device.

10. The method defined by claim 6, wherein providing at least one ECC bit based at least in part on data provided by the memory device is performed by the processing device.

11. A non-transitory computer-readable medium comprising instructions that, when executed by a processing device, cause the processing device to perform a computer process comprising:
calculating at least one error correcting code (ECC) bit based at least in part on data provided by a memory device; and
providing the at least one ECC bit to the processing device, the processing device comprising an ECC-based memory interface port, thereby eliminating a need to store the at least one ECC bit in the memory device;
providing at least one parity bit to the memory device based on data provided by the processing device while ignoring at least one ECC bit provided by said processing device;
selectively modifying the at least one ECC bit provided to the processing device as a function of the data provided by the memory device and at least one parity bit provided by the memory device; and
inverting a plurality of ECC bits to the processing device in response to the data provided by the memory device and the at least one parity bit provided by the memory device indicating an error associated with the data provided by the memory device.

12. The non-transitory computer-readable medium defined by claim 11, wherein the processing device does not support a parity-based memory device.

13. The non-transitory computer-readable medium defined by claim 11, wherein the memory device comprises at least one of a parity-based interface and an interface not requiring any error or parity-based protection.

14. The non-transitory computer-readable medium defined by claim 11, wherein the computer process further comprises;
providing a plurality of ECC bits; and
modifying selectively the plurality of ECC bits to the processing device as a function of the data provided by the memory device and the at least one parity bit provided by the memory device.

15. The non-transitory computer-readable medium defined by claim 11, wherein providing at least one ECC bit based at least in part on data provided by the memory device is performed by the processing device.

* * * * *